United States Patent [19]

Park

[11] Patent Number: 6,026,049
[45] Date of Patent: Feb. 15, 2000

[54] SEMICONDUCTOR MEMORY WITH SENSING STABILITY

[75] Inventor: Jong-Min Park, Suwon, Rep. of Korea

[73] Assignee: Samsung Electronics Co., Ltd., Kyungki-do, Rep. of Korea

[21] Appl. No.: 09/123,302

[22] Filed: Jul. 28, 1998

[30] Foreign Application Priority Data

Jul. 29, 1997 [KR] Rep. of Korea .................. 97-35817

[51] Int. Cl.[7] .................................................. G11C 13/00
[52] U.S. Cl. ................ 365/233; 365/230.08; 365/189.09; 365/185.01
[58] Field of Search ......................... 365/189.01, 189.09, 365/230.01, 230.08, 233, 185.01, 185.1

[56] References Cited

U.S. PATENT DOCUMENTS 5,337,274 8/1994 Ohji .................................. 365/185.01

*Primary Examiner*—Terrell W. Fears
*Attorney, Agent, or Firm*—F. Chau & Associates, LLP

[57] ABSTRACT

A semiconductor memory employing an address transition detecting function includes an address transition detection circuit which generates a first signal when a transition of an address signal occurs. The memory also includes a clock circuit for generating a second signal in response to the first signal and a pumping circuit for generating a boosted voltage higher than a power supply voltage used in the memory in response to the second signal. The second signal is applied to the pumping circuit when the boosted voltage is below a predetermined value. In this way, a voltage required for a read operation is maintained at an acceptable level and read operation reliability is improved.

7 Claims, 3 Drawing Sheets

SEMICONDUCTOR MEMORY WITH SENSING STABILITY

FIELD OF THE INVENTION

The present invention is in the field of nonvolatile memories and is more specifically related to nonvolatile memories employing a plurality of electrically alterable memory cells capable of being electrically programmable and erasable.

BACKGROUND OF THE INVENTION

Flash memory, which is one form of nonvolatile semiconductor memory, has attractive features, such as a faster operational speed and lower power consumption. These features enable use of these devices in portable systems, such as digital still cameras and personal computers, with advanced data reliability and enhanced power maintenance.

Typical construction of a cell (or cell transistor) used to form a flash memory device is shown in FIG. 1. Such a cell can be used to form a multi-bit storage device. Source 3 and drain 4, each being formed of an N+ diffused region in a P+ semiconductor substrate 2, are separated from each other by a channel region which is also defined in substrate 2. Floating gate 6 is formed over the channel region. A thin insulating film 7, which is under 100 Å, isolates the floating gate 6 from the channel region. Insulating film 9, such as an O—N—O (Oxide-Nitride-Oxide) film, on floating gate 6 isolates a control gate 8 from the floating gate 6. Source 3, drain 4, control gate 8 and substrate 2 are each connected to corresponding voltage sources Vs (drain voltage), Vd (source voltage), Vg (gate voltage) and Vb (bulk voltage), for programming, erasing and reading operations.

A selected memory cell is programmed by means of hot electron injection between the channel region and the floating gate 6, in which the source 3 and substrate 2 are held at a ground voltage potential, a high voltage (e.g., Vg=10V) is applied to the control gate 8 and a voltage to induce the hot electrons therein, about 5V to 6V, is provided to the drain 4. Once programmed, a threshold voltage of the selected memory cell is increases due to the deposition of electrons. To read data from the programmed cell, a voltage of about 1V is applied to the drain 4, a power source voltage (or about 4.5V) is applied to the control gate 8, and the source 3 is held at the ground voltage. Since the increased threshold voltage of the programmed memory cell acts as a blocking potential even upon the gate voltage during a read-out operation, the programmed cell is considered an off-cell which has a threshold voltage between 6V and 7V.

Erasing a memory cell is accomplished by conducting F-N (Fowler-Nordheim) tunneling effect, in which the control gate 8 is coupled to a negative voltage of about −10V, and the substrate 2 (or bulk) to a positive voltage of about 5V, in order to induce the tunneling therebetween. As a result, the drain 4 is conditioned at a high impedance state (or a floating state). A strong electric field between the control gate 8 and bulk region 2 is induced by the voltage bias conditions and causes the electrons to move into the source 3. The F-N tunneling normally occurs when an electric field of 6~7MV/cm is developed between the floating gate 6 and bulk region 2, which are separated by the thin insulating film 7. The erased cell has a lower threshold voltage than before, and is therefore sensed as an on-cell which has a threshold voltage between 1~3V.

In a usual architecture of a memory cell array in a flash memory, the bulk region (or the substrate) combines active regions of memory cells, so that memory cells formed in the same bulk region are spontaneously erased at the same time. Therefore, units of erasing (hereinafter referred to as "sector", for instance, one sector of 64K) are determined in accordance with the number of separate bulk regions 2. Table 1 shows levels of the voltages used in programming, erasing and reading.

TABLE 1

| operation mode | Vg | Vd | Vs | Vb |
|---|---|---|---|---|
| programming | 10V | 5 ~ 6V | 0V | 0V |
| erasing | −10V | floating | floating | 5V |
| reading | 4.5V | 1V | 0V | 0V |

As shown in FIG. 2, the range of voltage levels to detect a threshold voltage of a memory cell, which is applied to the control gate 8 through a word line, is preferably in the range of 3~6V (Vg; 4.5V in the table 1). If a selected memory cell has been programmed, a memory cell selected in the read operation is detected as the off-cell for the control gate voltage Vg. On the contrary, an erased cell is detected as the off-cell.

It is well known that a NOR-type flash memory features a higher read-out performance, i.e. access speed under 100 ns, than that of a NAND-type flash memory. The need for lower power consumption in portable devices forces memory products to operate with a lower power supply voltage, such as 3V, 2V or less. The gate voltage between 3V and 6V, required for reading, is regarded as a preferred value adaptable to such low power flash memories. The high voltages, as shown in Table 1, required for the programming and erasing operations are generated from internal boosting circuits (or pumping), which generate higher voltages than the power supply voltage (2V or 3V). In general, there needs to be at least two times more pumping cycles to generate the high potentials, 10V or −10V, which are applied to the control gate 8 for programming or erasing, and thereby a predetermined time to reach up to the appropriate voltage levels is required. In order to obviate a delay of the read-out operation, conventional flash memory devices always operate the pumping cycles in an independent operating mode so that the pumped voltage can be promptly applied to activated circuits assigned to the read-out operation. However, since the pumping voltage is being generated whenever the device is powered up, current consumption in a standby state is inevitable and thereby unnecessary power dissipation may occur.

An activation timing cycle of the pumping circuit is generally designed in correspondence with a nominal operation timing of the read-out cycle. Hence, under the designed features between the activation of the pumping circuit and read-out cycle timing, the pumping voltage may be consumed to concentrate current dissipation when an address transition occurs with an abnormal cycle time shorter than a specified read-out cycle time (e.g., tRC). Under extreme conditions, the amount of current dissipated for the address transition can be larger than that supplied from the pumping circuit, and, even worse, the pumping voltage could be lower than the appropriate voltage level for reading (e.g., 3~6V or 4.5V of Table 1). This condition can result in unreliable operation.

Furthermore, the conventional pumping circuit is not free from noise occurring in a read-out operation. The noise is induced from the pumping circuit which is designed to conduct according to normal read-out cycles, and not supplying current to internal circuits when address signals are varied (i.e., address transitions). Thus, it may be impossible to compensate dissipated current in the case of mismatching between the address transition and the oscillation cycle of the pumping circuit.

SUMMARY OF THE INVENTION

Accordingly, it is an object of the invention to provide a flash memory capable of securing a safe read-out performance even with a low power supply voltage.

It is another object of the invention to provide a flash memory having enhanced noise immunity from a power disturbance.

In order to accomplish those objects, the memory of the present invention, employing an address transition detecting function, includes means for generating a first signal whenever a transition of an address signal occurs, means for generating a second signal in response to the first signal, a cycle time of the second signal following that of the first signal, means for generating a boosted voltage higher than a power supply voltage used in the memory in response to the second signal, and means for generating a third signal controlling a transfer of the second signal. The third signal is generated in response to the detecting of a present level of the boosted voltage.

With respect to a practical aspect of the invention, the semiconductor memory includes an address transition detection circuit for generating a short pulse whenever a transition of an address signal occurs, an oscillator for generating a pumping clock in response to the short pulse, a cycle time of the pumping clock following the short pulse, a pumping circuit for generating a boosted voltage higher than a power supply voltage used in the memory, in response to the pumping clock, and means for generating a third signal controlling a transfer of the second signal, the third signal being generated in response to the detection of a present level of the boosted voltage.

BRIEF DESCRIPTION OF THE DRAWINGS

For a better understanding of the present invention, and to show how embodiments of the same may be carried into effect, reference will now be made, by way of example, to the accompanying drawings, in which.

In the figures, like reference numerals denote like or corresponding parts.

DETAILED DESCRIPTION OF PREFERRED EMBODIMENTS

Hereinbelow, exemplary embodiments of the present invention will be described, with reference to the appended drawings.

Figure 1:
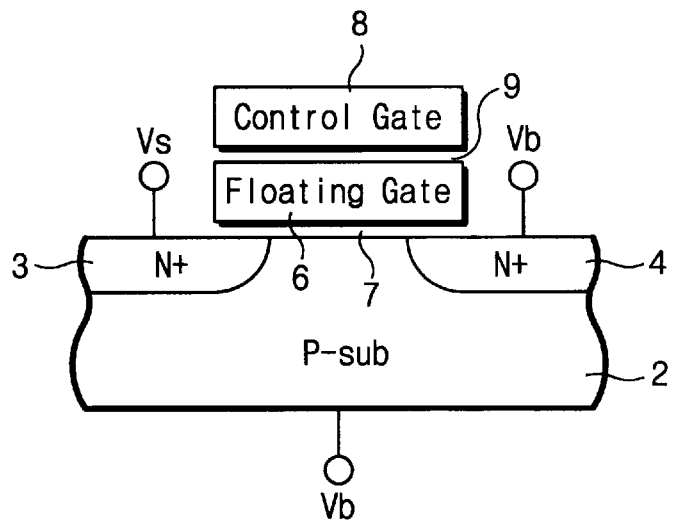
FIG. 1 is a sectional diagram illustrating a structure of a flash memory cell.
Figure 2:
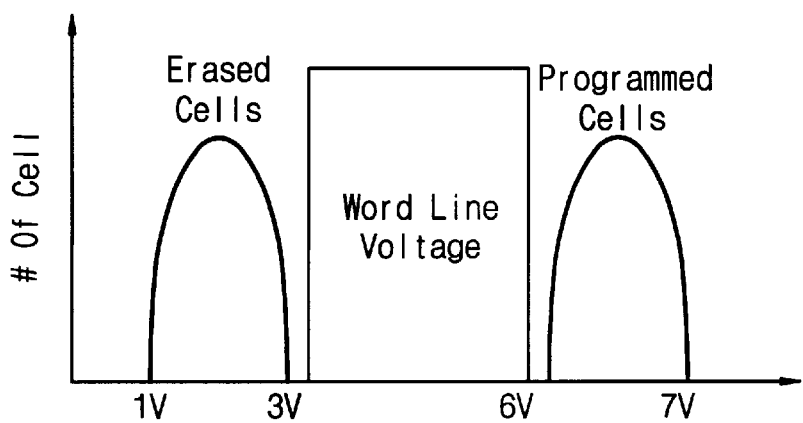
FIG. 2 is a graph which shows profiles of threshold voltages involved in programmed or erased cells.
Figure 3:
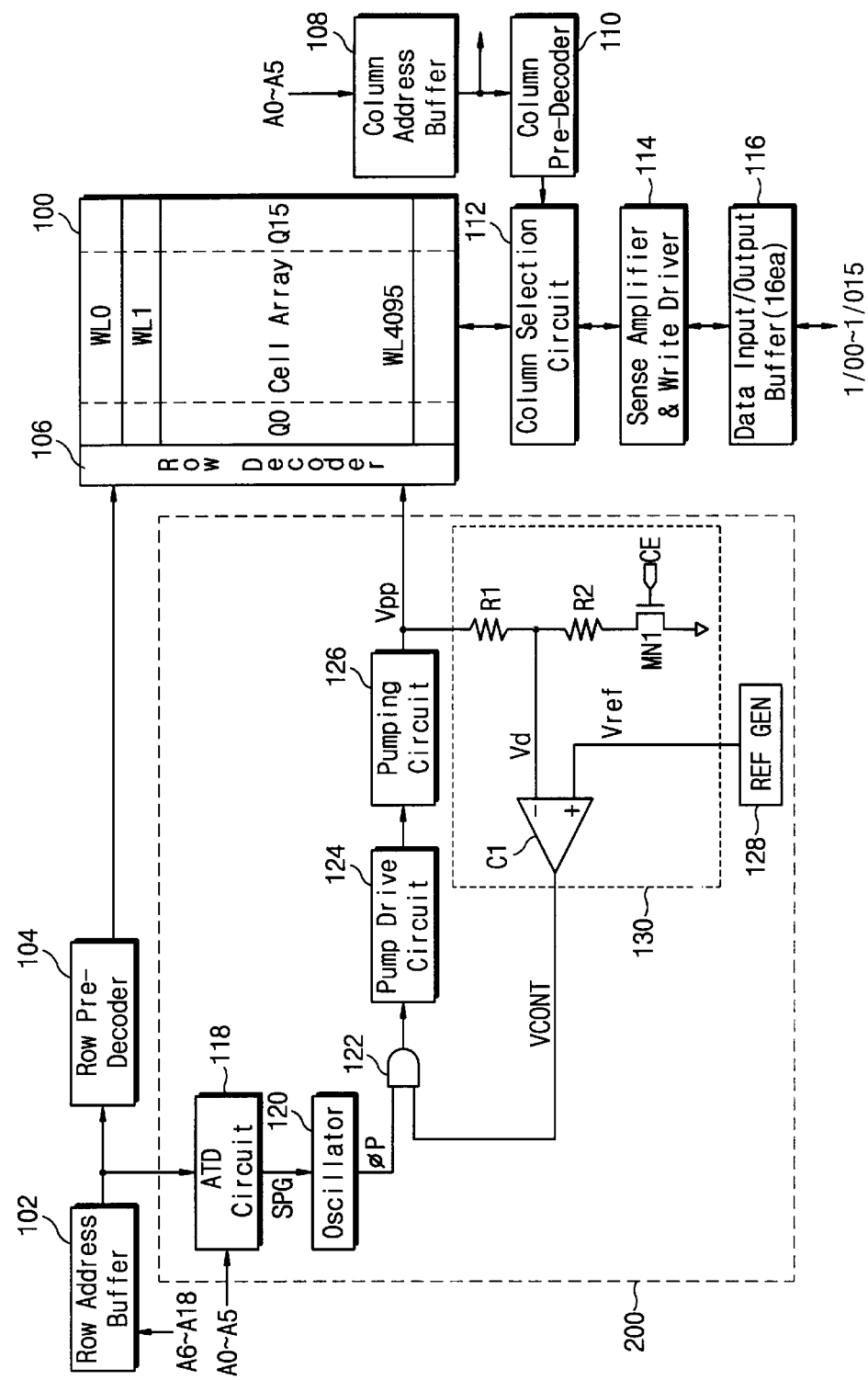
FIG. 3 is a block diagram illustrating a flash memory according to the present invention.

Referring to FIG. 3, cell array 100 is formed with eight sectors and sixteen input/output blocks, Q0 through Q15, corresponding to sixteen input/output pins (or pads) I/O0 through I/O15. The sectors of cell array 100 are units of erasing each of which is composed of row units with word lines WL0~WL511 (512 row units×8 sectors=4095 row units). Each of the input/output blocks is composed of a plurality of column units. Row address buffer 102 receives address signals A6~A18 from an external source and row pre-decoder 104 creates row pre-decoding signals from address signals supplied from row address buffer 102.

A row decoder 106 receives the pre-decoding signals from the row pre-decoder 104 and then activates a selected row (or a selected word line) in response thereto. Row decoder 106 applies pumping voltage Vpp generated from boosting circuit 200 to a selected word line. Column address buffer 108 receives address signals A0~A5 from the external source and a column pre-decoder 110 generates column pre-decoding signals from column address signals supplied from column address buffer 108 in order to select one of the input/output blocks Q0~Q15. Column selection circuit 112 connects a selected column to a data input/output buffer 116 through sense amplifier & write driver 114, in response to decoding signals provided from the column pre-decoder 110.

Boosting circuit 200 generates the pumping voltage Vpp (3~6V) at a level higher than a power supply voltage, which is generally lower than about 2V. The boosting circuit 200 includes an address transition detection (ATD) circuit 118, an oscillator 120, an AND gate circuit 122, a pump drive circuit 124, a pumping circuit 126 and a voltage regulation circuit 130. The ATD circuit 118 receives address signals from row and column address buffers 102 and 108, and then generates a short pulse SPG signal when at least one of the address signals varies. The width of short pulse SPG can be adjusted by a pulse generator. Oscillator 120 generates a pumping clock $\phi$P signal in response to the short pulse SPG supplied from the ATD circuit 118. The cycle time of the pumping clock $\phi$P signal is generally at least two times greater than the SPG signal.

Voltage regulation circuit 130 detects whether the pumping voltage Vpp is higher than a predetermined level (e.g., 3~6V) and then generates a voltage control signal VCONT in response to the detected level. The AND gate circuit 122 receives $\phi$P and VCONT, and controls the pump drive circuit 124 to adjust the operation of pumping circuit 126 in accordance with a level of pumping voltage Vpp which has been detected in the voltage regulation circuit 130. Voltage regulation circuit 130 is formed with resistors R1 and R2 for dividing Vpp, a transistor MN1 whose gate is coupled to a chip enable signal CE, and comparator C1. A voltage signal Vd appearing at the node between R1 and R2 is a first input voltage to comparator C1 and a reference voltage Vref generated from reference voltage generator 128 is a second input voltage to comparator C1. Comparator C1 generates a low-level VCONT signal when Vd is higher than Vref, so that $\phi$P cannot be transferred through AND gate 122 to the pump drive circuit 124. Therefore, Vpp is not further boosted. When Vd is lower than Vref, the pumping circuit 126 should perform the boosting operation in response to $\phi$P. Therefore, VCONT is set high, enabling the AND gate 122 and transferring $\phi$P from the oscillator 120 to the pump drive circuit 124.

Figure 4A:
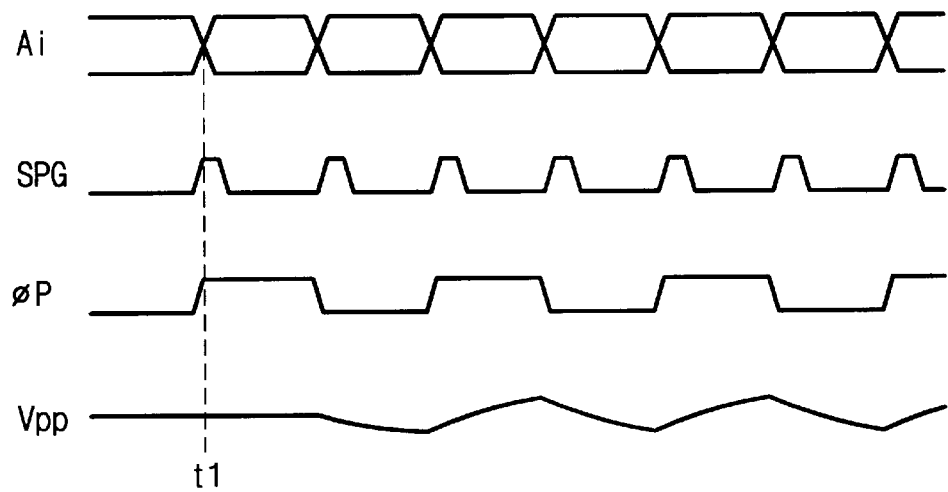
FIGS. 4A and 4B are timing diagrams showing waveforms of pumping clocks and read-out voltages.
Figure 4B:
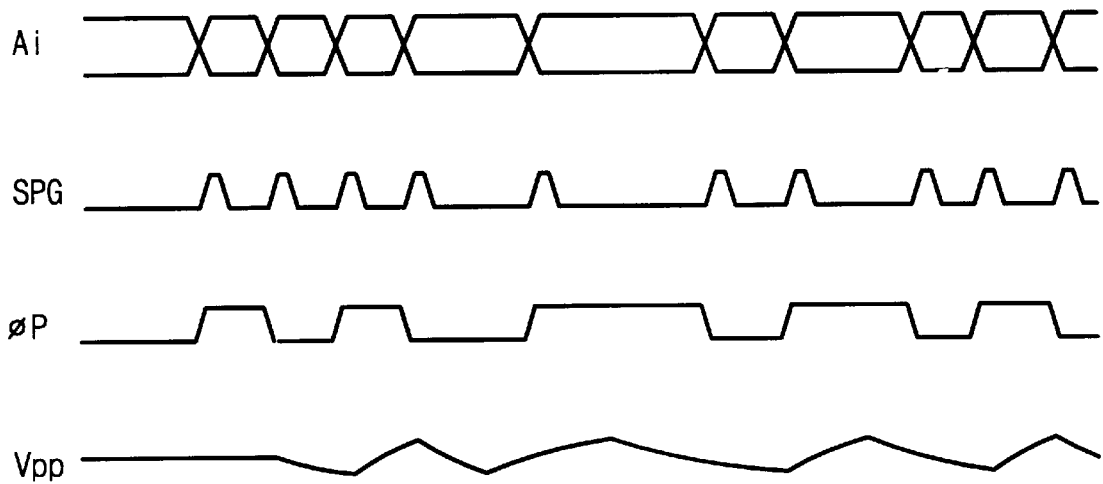

FIGS. 4A and 4B show operational timing diagrams for pumping, according to variations in pulse width of the SPG signal. The width of SPG in FIG. 4A is wider than that in FIG. 4B. Referring to FIG. 4A, at t1, short pulse SPG is generated when an address signal Ai changes states. Oscillator 120 generates $\phi$P, in a substantially synchronous manner to the odd-ordered and even-ordered occurrences of SPG. If the transition of address signal Ai occurs in a constant cycle time, the cycle time of the pumping clock $\phi$P becomes two times that of SPG. Alternatively, it is possible that the transition of address signal Ai occurs with an irregular time cycle, as shown in FIG. 4B. Even in that case, the cycle time of φP follows the variation in cycle time of SPG. The Pumping voltage Vpp is increased when φP is applied to pumping circuit 126 with a high level, and is decreased when φP is at a low level. Such increasing and decreasing of Vpp are controlled by the state of signal VCONT which determines whether to apply φP to the pumping circuit 126.

As described above, the pumping circuit follows variations of the short pulse signal in response to a transition of an address signal and is controlled by the voltage control signal detecting a present level of the pumping voltage. Accordingly, an abnormal failure resulting from an inappropriate level of the pumping voltage is prevented and the reliability of a read-out operation using the pumping voltage in a lower power flash memory is enhanced.

While this invention has been described in connection with what is presently considered to be the most practical and preferred embodiment, it is to be understood that the invention is not limited to the disclosed embodiment, but, on the contrary, is intended to cover various modifications and equivalent arrangements included within the scope of the invention.

What is claimed is:

1. A semiconductor memory employing an address transition detecting function comprising:

means for generating a first signal in response to a transition of an address signal;

means for generating a second signal in response to the first signal;

means for generating a boosted voltage higher than a power supply voltage used in the memory, in response to the second signal; and means for generating a third signal controlling a transfer of the second signal.

2. A semiconductor memory of claim 1, wherein the third signal is generated in response to a present level of the boosted voltage.

3. A semiconductor memory of claim 2, wherein said second signal is a clock signal.

4. A semiconductor memory of claim 3, wherein said clock signal is applied to said means for generating a boosted voltage when the present level of the boosted voltage is below a predetermined value.

5. A semiconductor memory employing an address transition detecting function comprising:

an address transition detection circuit for generating a short pulse when a transition of an address signal occurs;

an oscillator for generating a pumping clock signal in response to the short pulse;

a pumping circuit for generating a boosted voltage higher than a power supply voltage used in the memory, in response to the pumping clock signal; and means for selectively transferring the pumping clock signal in response to a present level of the boosted voltage.

6. A semiconductor memory of claim 5, wherein said means for selectively transferring the pumping clock signal includes:

a voltage reference circuit providing a reference voltage;

a comparator circuit, said comparator circuit being responsive to the reference voltage and the boosted voltage and providing an output signal indicative of the boosted voltage being less than said reference voltage; and a logic gate, said and gate receiving said comparator output signal and said pumping clock, said logic gate passing said pumping clock signal to said pumping circuit when said output signal indicates that the pumping voltage is below the reference voltage.

7. A semiconductor memory of claim 6, wherein said logic gate is an AND logic gate.

* * * * *